(12) United States Patent
Lee

(10) Patent No.: US 7,563,655 B2
(45) Date of Patent: Jul. 21, 2009

(54) METHOD OF FABRICATING THE LIQUID CRYSTAL DISPLAY DEVICE

(75) Inventor: Jung-Il Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 574 days.

(21) Appl. No.: 11/475,025

(22) Filed: Jun. 27, 2006

(65) Prior Publication Data

US 2007/0166856 A1  Jul. 19, 2007

(30) Foreign Application Priority Data

Dec. 30, 2005  (KR) .................. 10-2005-0136176

(51) Int. Cl.
*H01L 21/00* (2006.01)
(52) U.S. Cl. .................. 438/149; 438/69; 438/70; 438/72; 257/E21.001
(58) Field of Classification Search .......... 438/149, 438/69–70, 72; 257/E21.001
See application file for complete search history.

(56) References Cited

U.S. PATENT DOCUMENTS 6,555,409 B2 * 4/2003 Kim et al. .................. 438/34
7,300,830 B2 * 11/2007 Yoo et al. .................. 438/151

FOREIGN PATENT DOCUMENTS

CN  1707388  12/2005

* cited by examiner

*Primary Examiner*—Thanh Nguyen
(74) *Attorney, Agent, or Firm*—McKenna Long & Aldridge LLP

(57) ABSTRACT

The present invention provides a liquid crystal display device and a method of fabricating the same capable of reducing the number of mask processes. The liquid crystal display device and the method of fabricating the sane includes: forming a gate electrode and a common electrode on a substrate; forming a gate insulating layer, an active layer, and source/drain electrodes on the substrate including the gate electrode; forming a passivation layer on the entire substrate; forming a first photosensitive layer pattern on the passivation layer; selectively removing the passivation layer using the photosensitive layer pattern as a mask to form a plurality of holes; forming a conductive layer on the first photosensitive layer pattern including the plurality of holes; forming a second photosensitive layer on the conductive layer; selectively removing the photosensitive layer to expose the conductive layer; and selectively removing the exposed conductive layer portion, the remaining second photosensitive layer and the first photosensitive layer pattern to form a pixel electrode.

23 Claims, 5 Drawing Sheets

METHOD OF FABRICATING THE LIQUID CRYSTAL DISPLAY DEVICE

This application claims the benefit of Korean Patent Application No. 10-2005-0136176, filed on Dec. 30, 2006, which is hereby incorporated by reference for all purposes as if fully set forth herein.

BACKGROUND OF THE INVENTION

1. Field of the Invention

The present invention relates to a liquid crystal display device and a method of fabricating the same, and more particularly, to a liquid crystal display device and a method of fabricating the same capable of reducing the number of mask processes in fabricating the liquid crystal display device.

2. Discussion of the Background Art

A liquid crystal display device (hereinafter, referred to as LCD device) is light weight, slim, and low in power consumption, and thus is used for terminals of various information devices or video systems instead of a cathode ray tube (CRT). In particular, a TFT-LCD device including a thin film transistor has an excellent response characteristic and is suitable for a large number of pixels, and thus can implement a display device with high image quality and a wide screen.

In such a flat panel display, an active device such as a thin film transistor (TFT) is included in each pixel to drive a display device. This type of driving method of the display device is often called an active matrix driving method.

In the active matrix system, the active device is disposed in each of pixels arranged in a matrix to drive the pixel.

The general active matrix LCD device will now be described briefly.

N M pixels are arranged vertically and horizontally in a general LCD device. Each pixel of a thin film transistor LCD device includes a thin film transistor formed at a crossing region of a gate line and a data line that receive a scan signal and an image signal respectively from an external drive circuit.

The thin film transistor includes a gate electrode extending from the gate line a source electrode extending from a data line, and a drain electrode connected to a pixel electrode and a semiconductor layer formed between the source electrode and the drain electrode.

When a voltage is applied to the gate electrode through the gate line, the thin film transistor applies a data voltage applied to the source electrode through the data line to the drain electrode through a semiconductor channel layer.

When the data voltage is applied to the drain electrode, the data voltage is applied to the pixel electrode connected to a drain electrode, generating a voltage difference between the pixel electrode and a common electrode of the pixel. Then, a molecular arrangement of liquid crystals between the pixel electrode and the common electrode changes due to the voltage difference, thereby changing its optical transmittance.

That is, a visual difference results between the pixel to which the data voltage is applied and the pixel to which the data voltage is not applied.

Therefore, the LCD device serves as a display device through an assembly of pixels having visual differences.

A TFT-LCD device that employs a twisted nematic (TN) mode has a drawback of a limited viewing angle. However, an in plane switching (IPS) LCD device has recently been proposed to improve somewhat the limited viewing angle.

However, even though the IPS-LCD device implements a wide viewing angle, it still has problems of the low aperture ratio and transmittance. In order to solve such problems, a fringe field switching (hereinafter, referred to as FFS) LCD device is proposed.

A method of fabricating the FFS LCD device will now be described with reference to FIGS. 1A to 1E.

FIGS. 1A to 1E are cross-sectional views illustrating a method of fabricating a liquid crystal display device according to the related art.

Referring to FIG. 1A, indium tin oxide (ITO) that is a transparent material is deposited on a substrate 11, and then the ITO is selectively etched through exposure and development by a first mask process using a photolithography process to form a common electrode 13.

Referring to FIG. 1B, a metal material is stacked on the substrate 11, and then the metal material is etched through exposure and development by a second mask process using a photolithography process to form a gate electrode 15a. At this point, a storage node electrode 15b, a gate pad part 15c, and a data pad part 15d are also formed by etching the metal material.

Referring to FIG. 1C, a gate insulating layer 17, an active layer and a metal conductive layer are sequentially stacked on the overall substrate 11, and then the metal conductive layer and the active layer are sequentially etched through exposure and development by a third mask process using a diffraction exposure mask to form an active layer pattern 19, a source electrode 21a, and a drain electrode 21b at the same time.

Referring to FIG. 1D, a passivation layer 23 is formed on the overall substrate 11, and then the passivation layer 23 is selectively etched by a fourth mask process to form a contact hole 25a exposing the drain electrode 21b. At this point, in etching the passivation layer 23, openings 25b and 25c exposing the gate pad part 15c and the data pad part 15d are formed as well as the contact hole 25a.

Referring to FIG. 1E, a transparent conductive material such as ITO is deposited on the overall substrate 11 including the contact hole 25a, and then the transparent conductive layer is selectively etched through exposure and development by a fifth mask process to form a pixel electrode 27a electrically connected to the drain electrode 21b. At this point, in etching the transparent conductive layer, a gate pad 27b and a data pad 27c connected to the gate pad part 15c and the data pad part 15d respectively through the openings 25b and 25c are formed as well as the pixel electrode 27a.

However, as described above, the method of fabricating the LCD device according to the related art has the following drawbacks.

The method of fabricating the LCD device according to the related art requires at least five mask processes, that is the first mask process of forming the common electrode, the second mask process of forming the gate electrode, the third mask process of forming the active layer and the source/drain electrodes, the fourth mask process of forming the contact hole for connection with the drain electrode, and the fifth mask process of forming the pixel electrode.

Therefore, because at least five mask processes are required in fabricating the device, the fabricating process is complicated, and consequently the fabrication cost is increased.

SUMMARY OF THE INVENTION

Accordingly, the present invention is directed to a liquid crystal display device and method of fabricating the same that substantially obviates one or more of the problems due to limitations and disadvantages of the related art.

An advantage of the present invention is to provide a method of fabricating a liquid crystal display device (LCD device) capable of simplifying a fabricating process and decreasing the fabricating cost by reducing the number of mask processes in fabricating a device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a method of fabricating of a liquid crystal display device including: forming a gate electrode and a common electrode on a substrate; forming a gate insulating layer, an active layer, and source/drain electrodes on the substrate including the gate electrode; forming a passivation layer on the entire substrate; forming a first photosensitive layer pattern on the passivation layer; selectively removing the passivation layer using the photosensitive layer pattern as a mask to form a plurality of holes; forming a conductive layer on the first photosensitive layer pattern including the plurality of holes; forming a second photosensitive layer on the conductive layer; selectively removing the photosensitive layer to expose the conductive layer; and selectively removing the exposed conductive layer portion, the remaining second photosensitive layer and the first photosensitive layer pattern to form a pixel electrode.

In another aspect of the present invention, there is provided a method of fabricating of a liquid crystal display device including: forming a gate electrode and a common electrode on a first substrate; forming a gate insulating layer, an active layer, and source/drain electrodes on the first substrate including the gate pattern; forming a passivation layer on the entire first substrate; forming a photosensitive layer pattern on the passivation layer; selectively removing the passivation layer using the photosensitive layer pattern as a mask to form a plurality of holes; forming a conductive layer on the photosensitive layer pattern including the plurality of holes; forming a photosensitive layer on the conductive layer; exposing the conductive layer by selectively removing the photosensitive layer; removing the exposed conductive layer portion and the remaining photosensitive layer and photosensitive layer pattern to form a pixel electrode in the plurality of holes; forming a black matrix and a color filter layer on a second substrate; attaching the first substrate to the second substrate; and forming a liquid crystal layer between the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings.

Figure 1A:
FIG. 1A to 1E are cross-sectional views for illustrating a method of fabricating a liquid crystal display device according to the related art.
Figure 1B:
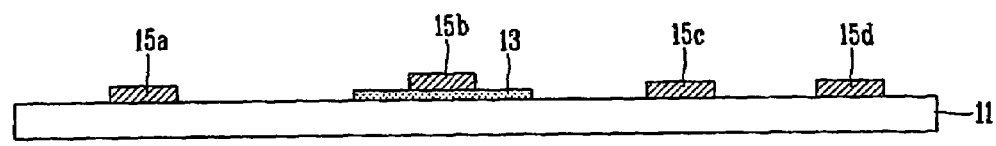
Figure 1C:
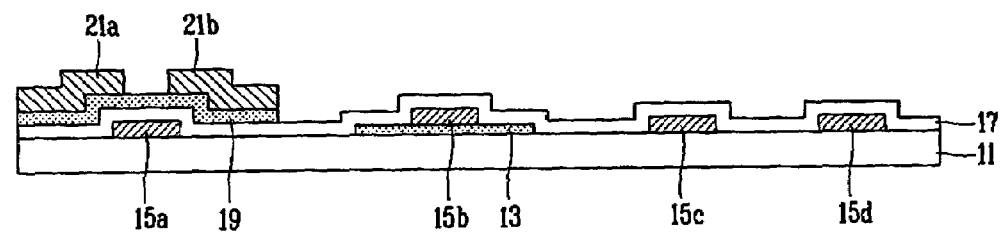
Figure 1D:
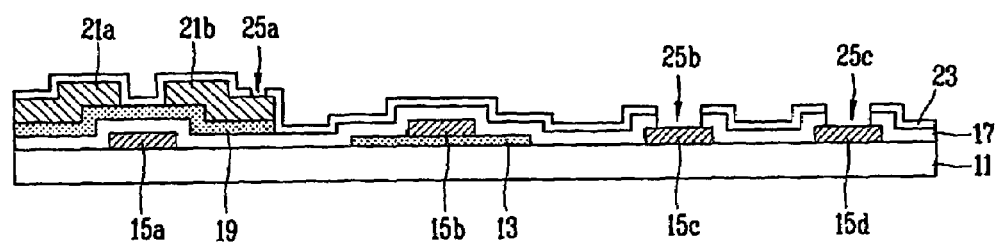
Figure 1E:
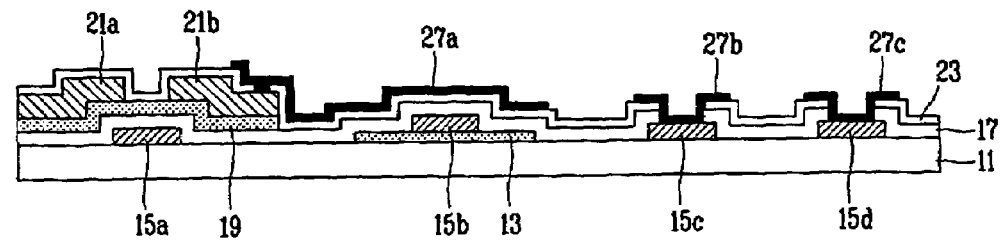
Figure 2:
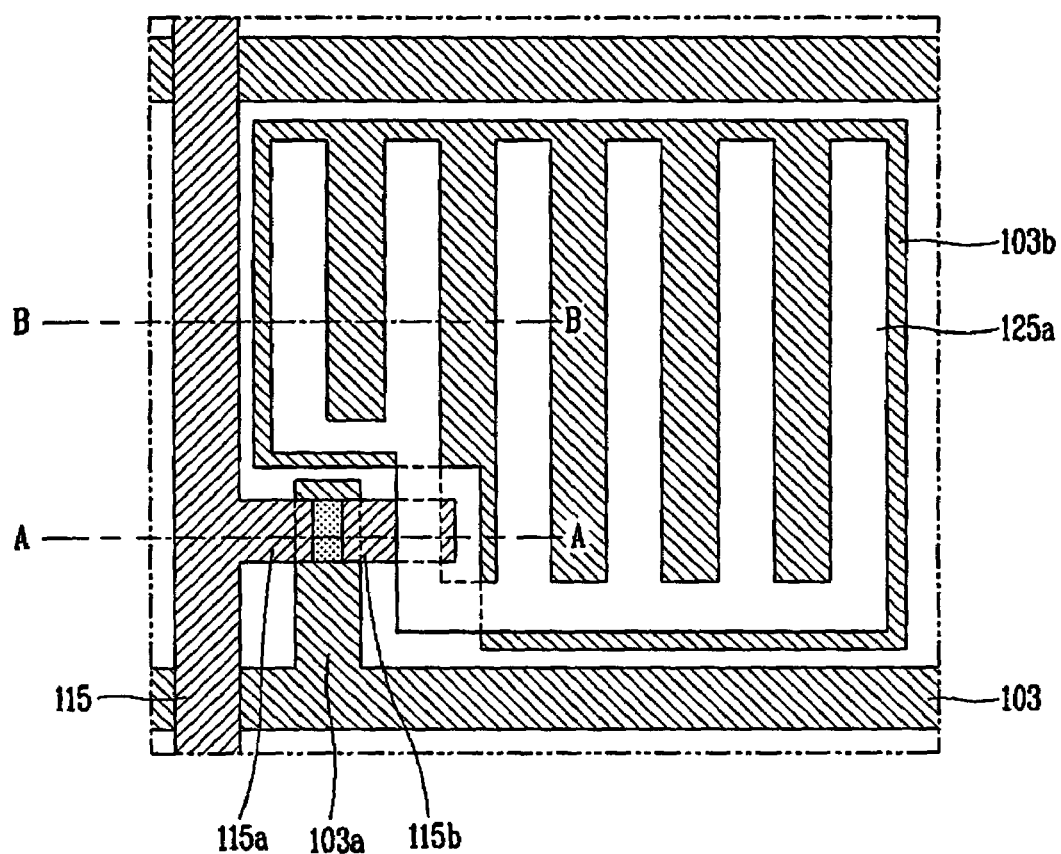
FIG. 2 is a plan view for schematically illustrating a liquid crystal display device according to the present invention.

FIG. 2 is a plan view for schematically illustrating a liquid crystal display device according to the present invention.

FIGS. 3A to 3J are cross-sectional views taken along the lines A-A and B-B illustrating a method of fabricating a liquid crystal display device according to the present invention.

Referring to FIG. 2, a liquid crystal display device (LCD device) according to the present invention includes a thin film transistor (not shown) formed in a crossing region of a gate line 103 and a data line 115. A scan signal is supplied to the gate line 103 and an image signal is supplied to the data line 115 from an external drive circuit.

The thin film transistor (not shown) includes a gate electrode 103a extending from the gate line 103, a source electrode 115a extending from the data line 115 a drain electrode 115b connected to a pixel electrode 125a, and an active layer (not shown) formed between the source electrode 115a and the drain electrode 115b.

Also, the thin film transistor (not shown) applies a data voltage applied to the source electrode 115a through the data line 115 to the drain electrode 115b through a semiconductor channel layer (not shown) when a voltage is applied to the gate electrode 103a through the gate line 103.

When the data voltage is applied to the drain electrode 115b, the data voltage is applied to the pixel electrode 125a connected to the drain electrode 115b, thereby generating a voltage difference between the pixel electrode 125a and a common electrode 103b in a pixel. Due to the voltage difference, the molecular arrangement changes in the liquid crystals (not shown) between the pixel electrode 125a and the common electrode 103b. Therefore, the optical transmittance changes to form an image.

A method of fabricating the LCD device having the aforementioned structure will now be described.

Figure 3A:
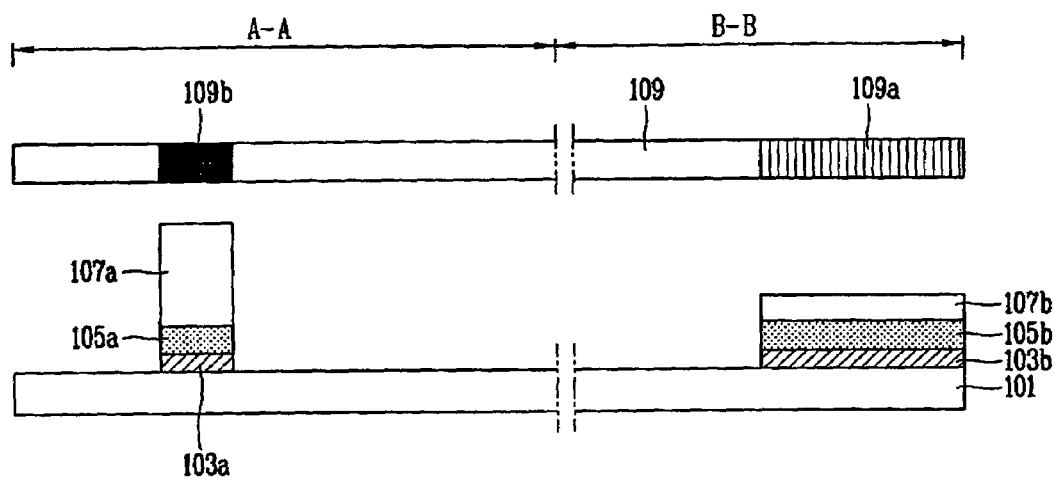
FIGS. 3A to 3J are cross-sectional views taken along lines A-A and B-B illustrating a method of fabricating a liquid crystal display device according to the present invention.

As illustrated in FIG. 3A, a transparent material layer such as ITO 103 and a metal material layer 105 for forming a gate are sequentially stacked on a substrate 101 including a TFT region and a pixel region, and then a first photosensitive layer (not shown) is coated on the metal material layer for gate.

In a first mask process, when a first mask 109 for diffraction exposure is positioned over the first photosensitive layer (not shown), a light such as an ultraviolet light is irradiated, and then a developing process is performed, forming a first photosensitive layer pattern 107a and 107b blocking the gate electrode forming region and the common electrode forming region. Here, one portion of the first photosensitive layer pattern 107b located on the common electrode forming region remains thinner than the other portion 107a thereof located on the gate electrode forming region. This is possible because a light is partially transmitted to the first photosensitive layer region located on the common electrode 103b whereas light is not transmitted to the gate electrode 103a forming region by using a semi-transmission part 109a and a light blocking part 109b of the first mask 109 for a diffraction exposure.

A metal conductive layer 105 and a transparent conductive layer 103 are sequentially etched using a portion 107a and the other portion 107b of the first photosensitive layer pattern having different thicknesses as masks to define a gate electrode part and a common electrode part.

Figure 3B:
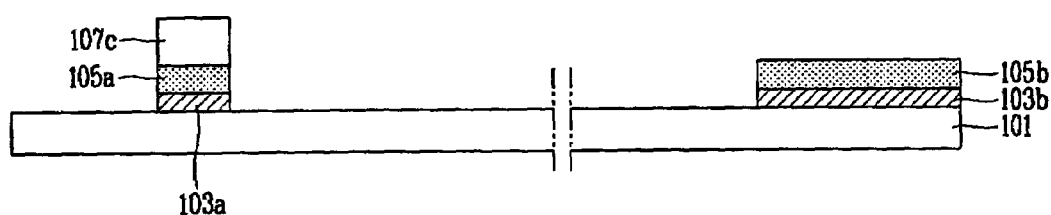

As illustrated in FIG. 3B, the first photosensitive layer patterns 107a and 107b are ashed to expose the metal conductive layer 105b located on the common electrode 103b. Here, the first photosensitive layer pattern 107a located on the metal conductive layer 105a is thoroughly removed, and the first photosensitive layer pattern 107b is partially removed.

Figure 3C:
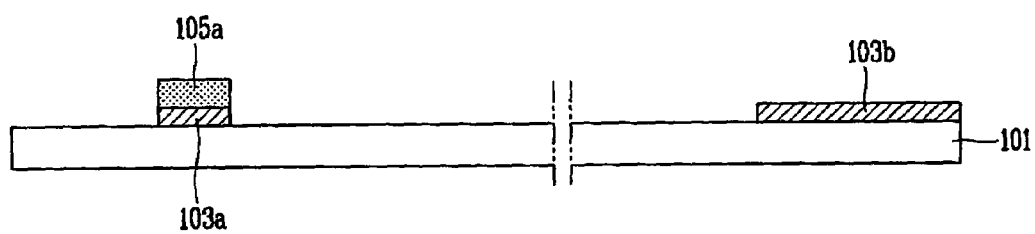

As illustrated in FIG. 3C, the exposed metal conductive layer 105b is thoroughly etched using the partially removed photosensitive layer pattern 107c as a mask, leaving only common electrode 103b.

Figure 3D:
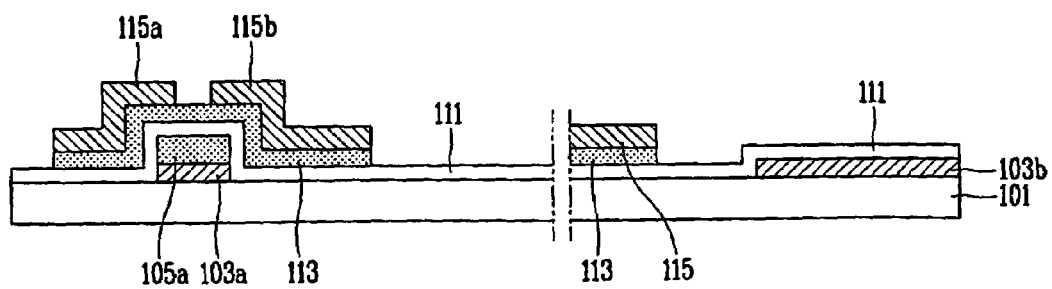

As illustrated in FIG. 3D, the first photosensitive layer pattern 107c is removed to form a gate electrode 105a.

An insulating material such as nitride is deposited on the entire substrate 101 to form a gate insulating layer 111, and then an active layer 113 and a metal conductive layer 115 are sequentially stacked thereon.

A second photosensitive layer (not shown) is coated on the conductive layer 115. In a second mask process, when a second mask for diffraction exposure is disposed over the second photosensitive layer, light such as ultraviolet light is irradiated, and then a developing process is performed to form a second photosensitive layer pattern (not shown). In the second mask process, a half tone mask may be used instead of the diffraction mask.

The metal conductive layer 115 and the active layer 113 are patterned using the second photosensitive layer pattern (not shown) as a mask.

A portion of the photosensitive layer pattern located on a channel region of the active layer 113 is removed through an ashing process to expose the metal conductive layer 115, and then the metal conductive layer 115 is selectively etched using the second photosensitive layer pattern (not shown) as a mask to form a source electrode 1 Sa and a drain electrode 115b.

Figure 3E:
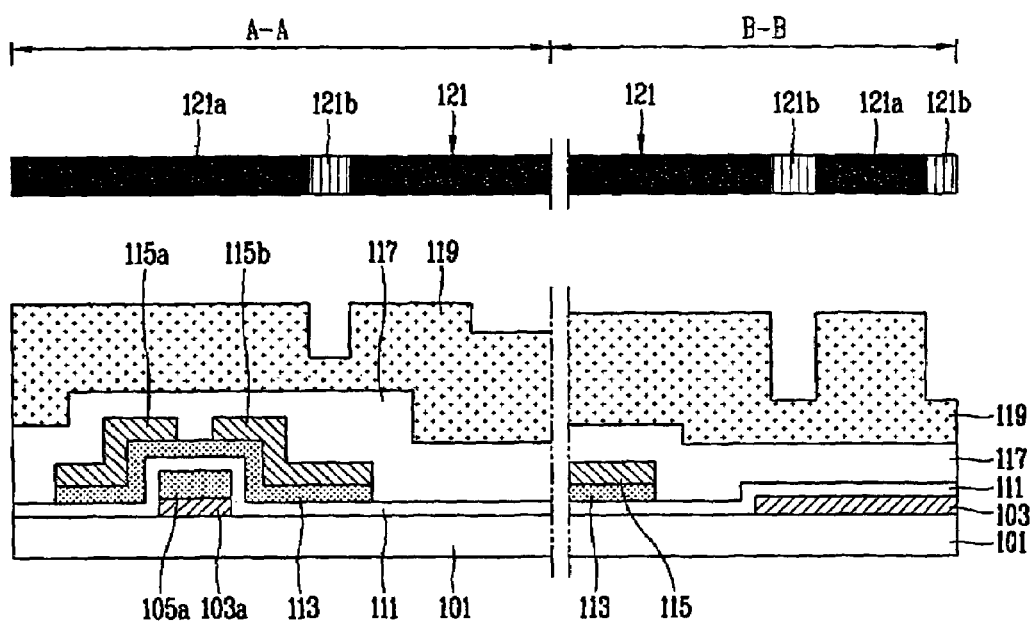

As illustrated in FIG. 3E, the second photosensitive layer pattern (not shown) is removed, then a passivation layer 117 is deposited on the entire substrate 101, and then a third photosensitive layer 119 is coated on the passivation layer 117.

In a third mask process, when a third mask for diffraction exposure 121 is positioned over the third photosensitive layer, light such as ultraviolet light is irradiated, and then a developing process is performed to form the third photosensitive layer pattern 119a. Here, one portion of the third photosensitive layer pattern 119 located over a drain contact hole forming region remains thinner than the other region thereof. This is possible by using a semi-transmission part 121b and a light-blocking part 121a of the third mask 121 for a diffraction exposure.

Figure 3F:
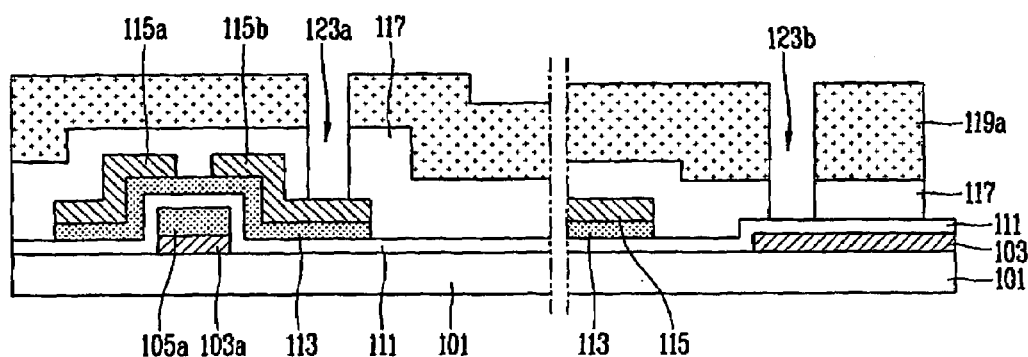

As illustrated in FIG. 3F, the third photosensitive layer pattern 119a is partially removed by performing an ashing process to expose a portion of the passivation layer 117 located on the drain contact hole forming region and pixel electrode forming region.

The exposed portion of the passivation layer 117 is selectively etched using the third photosensitive layer pattern 119a as a mask to form a plurality of holes 123a and 123b.

Figure 3G:
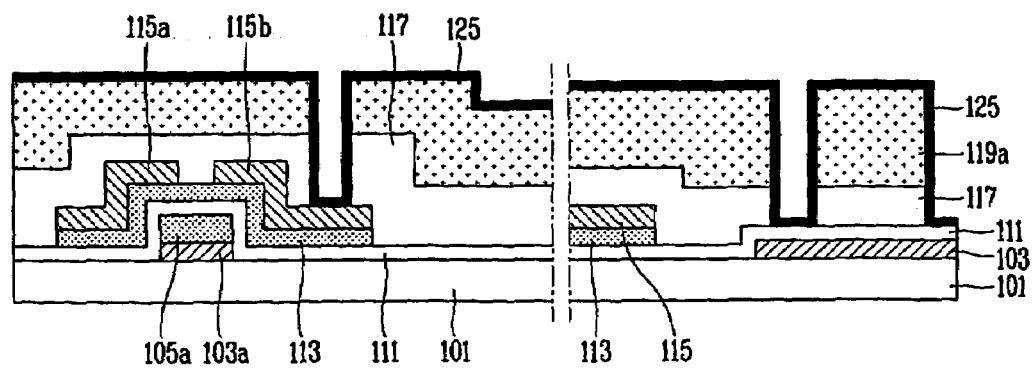

As illustrated in FIG. 3G, a transparent conductive material such as ITO or indium zinc oxide (IZO) is deposited on the entire substrate 101 including the third photosensitive layer pattern 119a by sputtering or deposition to form a transparent conductive layer 125.

Figure 3H:
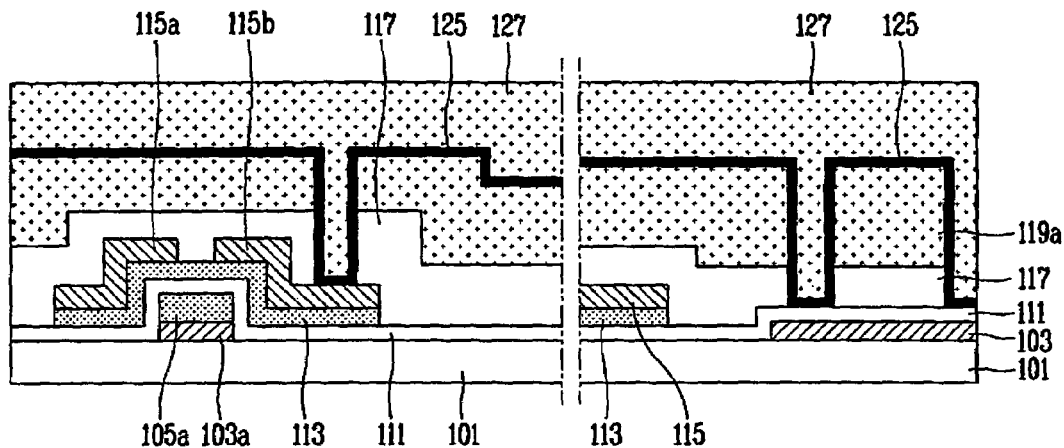

As illustrated in FIG. 3H, a fourth photosensitive layer 127 is coated on the transparent conductive layer 125.

Figure 3I:
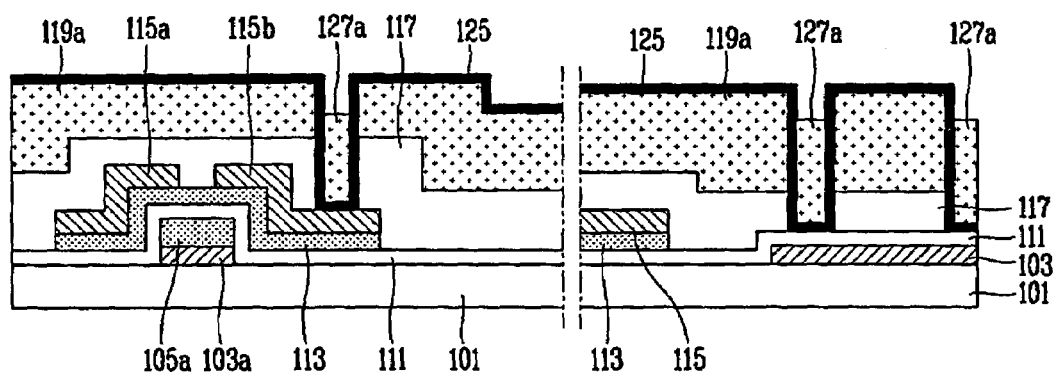

As illustrated in FIG. 3I, the transparent conductive layer 125 is removed by a predetermined thickness by performing an ashing process to expose the transparent conductive layer 125.

Figure 3J:
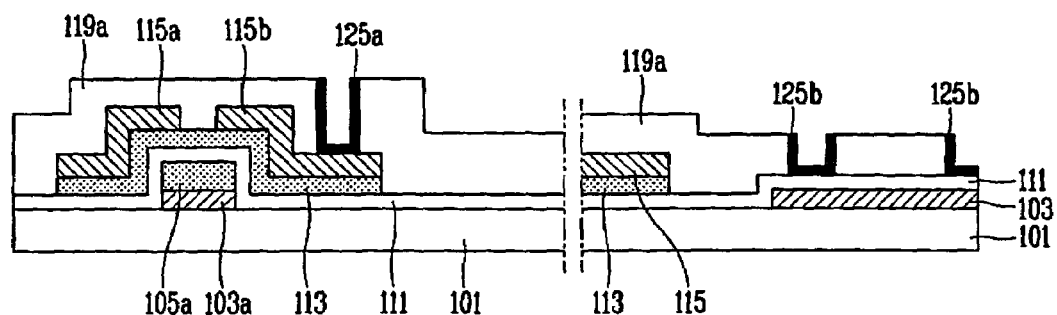

As illustrated in FIG. 3J, a portion of the transparent conductive layer 125 exposed outside the holes 123a and 123b is removed, and then the remaining fourth photosensitive layer 127 and third photosensitive layer pattern 119a are thoroughly removed, thereby forming a pixel electrode 125a electrically connected to the drain electrode 115b and a pixel electrode 125b overlapping the common electrode 103b.

Meanwhile, although not shown, a black matrix, a color filter layer, an overcoat layer, and other layers are selectively formed on an upper substrate (not shown).

The upper substrate is attached to a lower substrate, and then a liquid crystal layer (not shown) is formed between the upper and lower substrates, thereby forming the LCD device.

As described above, the LCD device and the method of fabricating the same according to the present invention has following effects.

According to the LCD device and the method of fabricating the same of the present invention, a fringe field switching (FFS) mode LCD device using three mask processes can be fabricated through the first mask process of forming the gate electrode and the common electrode, the second mask process of forming the active layer and the source/drain electrodes, the third mask process of forming the contact hole and the pixel electrode.

Therefore, because the device may be fabricated through three mask processes in comparison to the related art of fabricating the device through at least five mask processes, the number of processes can be reduced, and thus the fabrication time and the fabrication cost may be reduced.

In addition, the method of fabricating the LCD device according to the present invention may be applied to fabrication of a TN mode LCD device, a IPS mode LCD device as well as a FFS mode LCD device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device (LCD device), comprising:
    forming a gate electrode and a common electrode on a substrate;
    forming a gate insulating layer, an active layer, and source/drain electrodes on the substrate including the gate electrode;
    forming a passivation layer on the entire substrate;
    forming a first photosensitive layer pattern on the passivation layer;

selectively removing the passivation layer using the first photosensitive layer pattern as a mask to form a plurality of holes;

forming a conductive layer on the first photosensitive layer pattern including the plurality of holes;

forming a second photosensitive layer on the conductive layer;

selectively removing the second photosensitive layer to expose the conductive layer; and selectively removing the exposed conductive layer portion, the remaining second photosensitive layer and the first photosensitive layer pattern to form a pixel electrode.

2. The method of fabricating the LCD device of claim 1, wherein the forming of the gate electrode and the common electrode on the substrate is performed using a diffraction exposure process or a process using half tone mask.

3. The method of fabricating the LCD device of claim 2, wherein the diffraction exposure process includes:

stacking a transparent electrode layer and a gate conductive layer on the substrate;

forming a photosensitive layer on the gate conductive layer and then positioning a diffraction exposure mask thereon;

forming a photosensitive layer pattern by performing an exposure and development process using the diffraction exposure mask; and sequentially etching the gate conductive layer and the transparent electrode layer using the photosensitive layer pattern as a mask.

4. The method of fabricating the LCD device of claim 3, wherein a portion of the photosensitive layer pattern located on the transparent electrode layer for forming a transparent electrode is formed thinner than another portion of the photosensitive layer pattern located on a gate electrode layer for forming a gate electrode.

5. The method of fabricating the LCD device of claim 3, wherein the transparent electrode layer to be formed as the transparent electrode is exposed by ashing the photosensitive layer pattern.

6. The method of fabricating the LCD device of claim 1, wherein the forming of the active layer and the source/drain electrodes includes:

forming a gate insulating layer on the gate electrode;

sequentially stacking an active layer and a conductive layer on the gate insulating layer;

forming a photosensitive layer pattern by exposing and developing a photosensitive layer through a diffraction exposure process using a diffraction exposure mask after forming the photosensitive layer on the conductive layer; and defining an active layer pattern and the source/drain electrodes by selectively removing the active layer and the conductive layer using the photosensitive layer pattern as a mask.

7. The method of fabricating the LCD device of claim 6, wherein the diffraction exposure process comprises:

coating the photosensitive layer on the conductive layer and positioning the diffraction exposure mask thereon; and forming the photosensitive layer pattern by performing the exposure and the development process using the diffraction exposure mask.

8. The method of fabricating the LCD device of claim 7, wherein a part of the conductive layer portion located on a channel region is exposed by ashing the photosensitive layer pattern.

9. The method of fabricating the LCD device of claim 6, further including forming the source/drain electrodes by removing the conductive layer portion located on the channel region using the remaining photosensitive layer pattern as a mask.

10. The method of fabricating the LCD device of claim 1, wherein the forming of the first photosensitive layer pattern on the passivation layer is performed through an diffraction exposure process.

11. The method of fabricating the LCD device of claim 1, wherein the exposing of the conductive layer by selectively removing the second photosensitive layer is performed through an ashing process.

12. A method of fabricating a liquid crystal display device (LCD device) comprising:

forming a gate electrode and a common electrode on a first substrate;

forming a gate insulating layer, an active layer, and source/drain electrodes on the first substrate including the gate pattern;

forming a passivation layer on the entire first substrate;

forming a first photosensitive layer pattern on the passivation layer;

selectively removing the passivation layer using the first photosensitive layer pattern as a mask to form a plurality of holes;

forming a conductive layer on the first photosensitive layer pattern including the plurality of holes;

forming a second photosensitive layer on the conductive layer;

exposing the conductive layer by selectively removing the second photosensitive layer;

removing the exposed conductive layer portion and the remaining second photosensitive layer and first photosensitive layer pattern to form a pixel electrode in the plurality of holes;

forming a black matrix and a color filter layer on a second substrate;

attaching the first substrate to the second substrate; and forming a liquid crystal layer between the first and second substrates.

13. The method of fabricating the LCD device of claim 12, wherein the forming of the gate pattern and the common electrode on the substrate is performed through a diffraction exposure process or a process using a half tone mask.

14. The method of fabricating the LCD device of claim 13, wherein the diffraction exposure process includes:

stacking a transparent electrode layer and a gate conductive layer on the substrate;

coating a photosensitive layer on the gate conductive layer and then positioning a diffraction exposure mask thereon;

forming a photosensitive layer pattern by performing exposure and development process using the diffraction exposure mask; and sequentially etching the gate conductive layer and the transparent electrode layer using the photosensitive layer pattern as a mask.

15. The method of fabricating the LCD device of claim 14, wherein a portion of the photosensitive layer pattern located on the transparent electrode layer for forming a transparent electrode is formed thinner than another portion of the photosensitive layer pattern located on a gate electrode layer for forming a gate electrode.

16. The method of fabricating the LCD device of claim 14, wherein the transparent electrode layer to be formed as the transparent electrode is exposed by ashing the photosensitive layer pattern.

17. The method of fabricating the LCD device of claim 12, wherein the forming of the active layer and the source/drain electrodes includes:
   forming a gate insulating layer on the gate electrode;
   sequentially stacking an active layer and a conductive layer on the gate insulating layer;
   forming a photosensitive layer pattern by exposing and developing a photosensitive layer through a diffraction exposure process using a diffraction exposure mask after forming the photosensitive layer on the conductive layer; and
   defining an active layer pattern and the source/drain electrodes by selectively removing the active layer and the conductive layer using the photosensitive layer pattern as a mask.

18. The method of fabricating the LCD device of claim 17, wherein the diffraction exposure process includes:
   coating the photosensitive layer on the conductive layer and positioning the diffraction exposure mask thereon; and
   forming the photosensitive layer pattern by performing the exposure and the development process using the diffraction exposure mask.

19. The method of fabricating the LCD device of claim 18, wherein the conductive layer portion located on a channel region is exposed by ashing the photosensitive layer pattern.

20. The method of fabricating the LCD device of claim 12, further comprising forming the source/drain electrodes by removing the conductive layer portion located on the channel region using the remaining first photosensitive layer pattern as a mask.

21. The method of fabricating the LCD device of claim 12, wherein the forming of the first photosensitive layer pattern on the passivation layer is performed through an diffraction exposure process.

22. The method of fabricating the LCD device of claim 19, wherein the exposing of the conductive layer by selectively removing the second photosensitive layer is performed through an ashing process.

23. The method of fabricating the LCD of claim 18, further comprising forming the source/drain electrodes by removing the conductive layer portion located on the channel region using the remaining photosensitive layer pattern as a mask.

\* \* \* \* \*